United States Patent
Okada et al.

(10) Patent No.: US 7,110,730 B2
(45) Date of Patent: Sep. 19, 2006

(54) APPARATUS FOR MOBILE COMMUNICATION SYSTEM WHICH PERFORMS SIGNAL TRANSMISSION BY AMPLITUDE MODULATION AND PHASE MODULATION

(75) Inventors: Kazuhisa Okada, Kiryu (JP); Kazuhiko Hikasa, Hamura (JP); Patrick Wurm, Cambridge (GB); David Freeborough, Cambridge (GB)

(73) Assignees: Hitachi, Ltd., Tokyo (JP); TTP Com Limited, Hertfordshire (GB)

( * ) Notice: Subject to any disclaimer, the term of this patent is extended or adjusted under 35 U.S.C. 154(b) by 404 days.

(21) Appl. No.: 10/372,950

(22) Filed: Feb. 26, 2003

(65) Prior Publication Data

US 2004/0198273 A1    Oct. 7, 2004

(30) Foreign Application Priority Data

May 31, 2002   (GB) ................. 0212732.2

(51) Int. Cl.
    *H01Q 11/12* (2006.01)
    *H04B 1/04* (2006.01)
(52) U.S. Cl. ............ 455/127.2; 455/108; 455/110; 332/145
(58) Field of Classification Search ............ 455/126, 455/127.1, 127.2, 127.3, 108, 110; 330/278, 330/296, 297; 332/144, 145
See application file for complete search history.

(56) References Cited

U.S. PATENT DOCUMENTS

| | | | |
|---|---|---|---|
| 5,235,289 A | 8/1993 | Kunitomo | |
| 5,745,526 A * | 4/1998 | Kumm et al. | 375/297 |
| 6,166,598 A | 12/2000 | Schlueter | |
| 6,351,189 B1 * | 2/2002 | Hirvilampi | 330/296 |
| 6,366,177 B1 | 4/2002 | McCune et al. | |
| 6,377,784 B1 | 4/2002 | McCune | |
| 6,480,061 B1 * | 11/2002 | Dolman et al. | 330/2 |
| 6,566,944 B1 * | 5/2003 | Pehlke et al. | 330/10 |
| 6,665,525 B1 * | 12/2003 | Dent et al. | 455/108 |
| 6,785,521 B1 * | 8/2004 | Hadjichristos et al. | 455/108 |
| 6,839,549 B1 * | 1/2005 | Pehlke et al. | 455/127.1 |
| 2001/0014593 A1 | 8/2001 | McCune | |
| 2003/0155978 A1 * | 8/2003 | Pehlke | 330/296 |

FOREIGN PATENT DOCUMENTS

| | | |
|---|---|---|
| EP | 734 118 | 9/1996 |
| EP | 771 068 | 5/1997 |
| GB | 2 369 734 | 6/2002 |
| GB | 2-370435 | 6/2002 |
| GB | 2369941 | 6/2002 |

* cited by examiner

Primary Examiner—Nguyen T. Vo
(74) Attorney, Agent, or Firm—Mattingly, Stanger, Malur & Brundidge, P.C.

(57) ABSTRACT

A mobile communication system has a mobile phone in which a voltage is set corresponding to the characteristic variation of a PA even when a PA having characteristic variation is used. The mobile phone employs a polar loop method, which comprises an antenna (1) for transmission and reception of signal waves; an antenna switch (2) for switching the transmission mode and the reception mode; a BBLSI (3) having a function to control the transmission and reception; an RFIC (4) having a function for modulating and demodulating the transmitted and received signals; and a PA (5) for amplifying up to the target output power by means of the amplitude modulation at the time of the transmission.

2 Claims, 5 Drawing Sheets

RANGE WHERE LINEARITY IS REQUIRED

RANGE WHERE LINEARITY IS REQUIRED

REQUIRED MAXIMUM OUTPUT

APPARATUS FOR MOBILE COMMUNICATION SYSTEM WHICH PERFORMS SIGNAL TRANSMISSION BY AMPLITUDE MODULATION AND PHASE MODULATION

CROSS-REFERENCES TO RELATED APPLICATIONS

The following applications, including this one, are being filed concurrently, and the disclosure of the other applications are incorporated by reference into this application in their entirely for all purposes:

U.K. Patent Application No. 0212737.1 (filed on May 31, 2002) entitled "APPARATUS FOR RADIO TELECOMMUNICATION SYSTEM AND METHOD OF BUILDING UP OUTPUT POWER"

U.K. Patent Application No. 0212725.6 (filed on May 31, 2002) entitled "A COMMUNICATION SEMICONDUCTOR INTEGRATED CIRCUIT, A WIRELESS COMMUNICATION APPARATUS, AND A LOOP GAIN CALIBRATION METHOD"

U.K. Patent Application No. 0212729.8 (filed on May 31, 2002) entitled "TRANSMITTER AND SEMICONDUCTOR INTEGRATED CIRCUIT FOR COMMUNICATION"

U.K. Patent Application No. 0212723.1 (filed on May 31, 2002) entitled "SEMICONDUCTOR INTEGRATED CIRCUIT FOR COMMUNICATION, RADIO-COMMUNICATIONS APPARATUS, AND TRANSMISSION STARTING METHOD"

U.K. Patent Application No. 0212735.5 (filed on May 31, 2002) entitled "SEMICONDUCTOR INTEGRATED CIRCUIT DEVICE FOR COMMUNICATION"

U.K. Patent Application No. 0212732.2 (filed on May 31, 2002) entitled "APPARATUS FOR MOBILE COMMUNICATION SYSTEM"

TECHNICAL FIELD OF THE INVENTION

The present invention relates to a technique effectively applied to an apparatus for mobile communication system such as a mobile phone in which a power amplifier (hereinafter, referred to as PA) is built. More particularly, the present invention relates to a technique effectively used in an apparatus for mobile communication system capable of supplying a voltage corresponding to a characteristic variation of a PA.

BACKGROUND OF THE INVENTION

According to the examinations made by the inventors of the present invention, with respect to the apparatus for mobile communication system such as a mobile phone, the following techniques are known.

For example, in a mobile phone, a PA in which a semiconductor amplifier device such as a MOSFET or a GaAs-MESFET is used in an output section of the transmission side is built in addition to a base band LSI (hereinafter, referred to as BBLSI) as a control circuit device having a function to control the transmitting and receiving of signal and a radio frequency IC (hereinafter, referred to as RFIC) as a radio frequency circuit. The PA amplifies up to the required output voltage for communications and then outputs the output voltage.

SUMMARY OF THE INVENTION

With respect to the mobile phone as described above, in the RFIC compatible with EDGE (Enhanced Data transmitted for GMS Evolution) based on GSM (Global System for Mobile Communication) system, a technique employing a polar loop method has been proposed in which feedback is applied while isolating amplitude modulation (AM) components and phase modulation (PM) components from each other. Therefore, an AM loop including the modulation amplitude components using the PA is constructed and the linearity is required for the PA characteristic.

However, in the case where a mobile phone is constructed by the use of the conventional technique, the RFIC compatible with the EDGE employing the polar loop method causes the increase of the load on the PA characteristic. More specifically, it becomes necessary to select a PA corresponding to each RFIC when constructing various specifications of mobile phones. And in this case, there occurs a problem that no PAs can be available except the specific PAs having no characteristic variation.

In such a circumstance, while placing a particular focus on the characteristic variation of the PA, the inventors of this invention have conceived to use the compensation of characteristic variation of the PA with an aim to be suited to the RFIC compatible with EDGE. For its achievement, while focusing on the bias voltage at the time of the amplitude modulation as a factor to determine the characteristic of the PA, the inventors have found out the method of setting the bias voltage depending on the characteristic of the PA so that the target output power can be achieved.

Considering the foregoing, an object of the present invention is to provide an apparatus for mobile communication system capable of constructing a system such as a mobile phone by setting a voltage corresponding to the characteristic variation of the PA even in a case where the PA having characteristic variation is used.

The above and other objects and novel characteristics of the present invention will be apparent from the descriptions and the accompanying drawings of this specification.

The advantages achieved by the typical ones of the inventions disclosed in this application will be briefly described as follows.

More specifically, the present invention is applied to an apparatus for mobile communication system such as a mobile phone performing data transmission of EDGE system including the amplitude modulation, wherein the apparatus for mobile communication system is provided with a BBLSI for controlling the transmitting and receiving of signal, an RFIC for modulating and demodulating the transmitting and receiving signals, and a PA for amplifying up to the target output power by means of the amplitude modulation at the time of the transmitting. Also, the present invention has characteristics as follows.

(1) Provided is a controllable voltage source (e.g., a register and a DAC (Digital to Analog Converter)), which can optionally set the bias voltage or the power supply voltage corresponding to the characteristic variation of the PA so that the target output power can be achieved at the time of amplitude modulation in the PA. Thus, an apparatus for mobile communication system can be constructed by setting the bias voltage or the power supply voltage corresponding to the characteristic variation of the PA even when the PA having characteristic variation is used.

(2) A system configuration is accomplished, in which the connection between the PA and the BBLSI or the RFIC for setting the bias voltage or the power supply voltage is made by means of one pin. Thus, the connection between the PA and the BBLSI or the RFIC by means of the one pin makes it possible to supply the bias voltage or the power supply voltage.

(3) A system configuration is accomplished, in which the DAC is built in the PA, the BBLSI, or the RFIC. In this configuration, the DAC and the RFIC or the BBLSI are connected to each other by the use of the one analog pin when the DAC is built in the RFIC or the BBLSI. Alternatively, the DAC and PA are connected to each other by the use of the one pin (BBLSI) for serial interface using digital signal when the DAC is built in the PA. Thus, when installing the DAC in the RFIC, the BBLSI, or the PA, the connection therebetween can be made by the use of one pin terminal and one line to supply the bias voltage or the power supply voltage.

DESCRIPTION OF THE EMBODIMENTS

Hereinafter, embodiments of the present invention will be described in detail based on the accompanying drawings. Note that components having the same function are denoted by the same reference symbol throughout the drawings for describing the embodiments, and the repetitive description thereof will be omitted.

Although not particularly limited, the apparatus for mobile communication system to which the present invention is applied is applied to a mobile phone having a PA built therein, and an example of the mobile phone will be described below.

Figure 1:
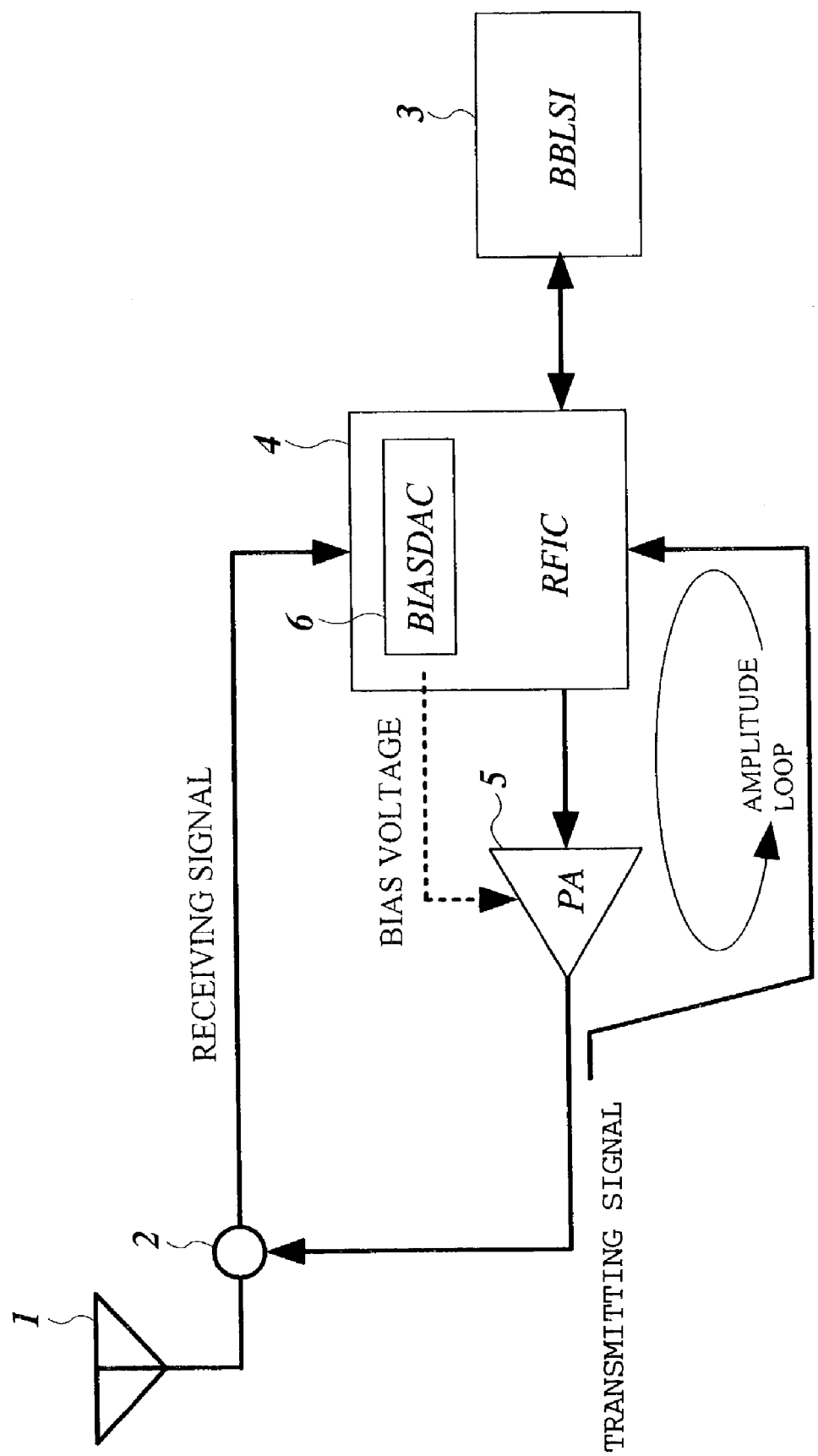
FIG. 1 is a schematic block diagram showing a mobile phone according to an embodiment of the present invention.

An example of a configuration of a mobile phone in an embodiment of the present invention will be described based on FIG. 1. FIG. 1 shows a schematic configuration of a mobile phone in this embodiment.

The mobile phone mentioned in this embodiment is one employing the polar loop, which comprises an antenna 1 for the transmitting and receiving of signal waves, an antenna switch 2 for switching the transmission mode and the reception mode, a BBLSI 3 having a function to control the transmission and reception, an RFIC 4 having a function for modulating and demodulating the transmitted and received signals, and a PA 5 for amplifying up to the target output power by means of the amplitude modulation at the time of the transmission.

The BBLSI 3 is a control circuit device that is bidirectionally connected to the RFIC 4 and is constituted of a DSP (Digital Signal Processor), a microprocessor, a semiconductor memory, and the like. The BBLSI 3 has functions to convert an audio signal to a base band signal at the time of transmitting, to convert a received signal to an audio signal at the time of receiving, and also to generate signals for switching modulation methods and those for switching a band at the time of the transmitting and receiving.

The RFIC 4 is a radio frequency circuit constituted of, for example, a PLL synthesizer having a VCO, a modulator, a demodulator, a divider, a mixer, a switch, and the like, and the RFIC 4 is connected to the antenna switch 2 connecting to the antenna 1, the BBLSI 3, and to the PA 5. The RFIC 4 has functions to generate oscillation signals having multiple frequency bands, to modulate the transmitted signals at the time of transmitting, to demodulate the received signal at the time of receiving, and to switch the modes of GSM, DCS (Digital Cellular System), and PCS (Personal Communication System).

The PA 5 is a power amplifier connected to the antenna switch 2 connecting to the antenna 1 and to the RFIC 4. The PA 5 has functions to amplify up to the output power required for communications and to output the voltage thus obtained.

In the mobile phone having the above-mentioned configuration, since the polar loop is employed, a loop is formed in which feedback is applied while isolating amplitude modulation components and phase modulation components from each other. Particularly, the amplitude loop includes the amplitude modulation components using the PA 5 and has a path starting from the RFIC 4 and returning back to the RFIC 4 through the PA 5, wherein the bias voltage of the PA 5 is supplied from the RFIC 4, and whereby the PA 5 can be used efficiently.

Note that FIG. 1 shows an example where a BIASDAC 6 for supplying a bias voltage of the PA 5 is built in the RFIC 4. However, it is also possible to install the BIASDAC 6 in the PA 5 or in the BBLSI 3. Details thereof will be described later.

Figure 2:
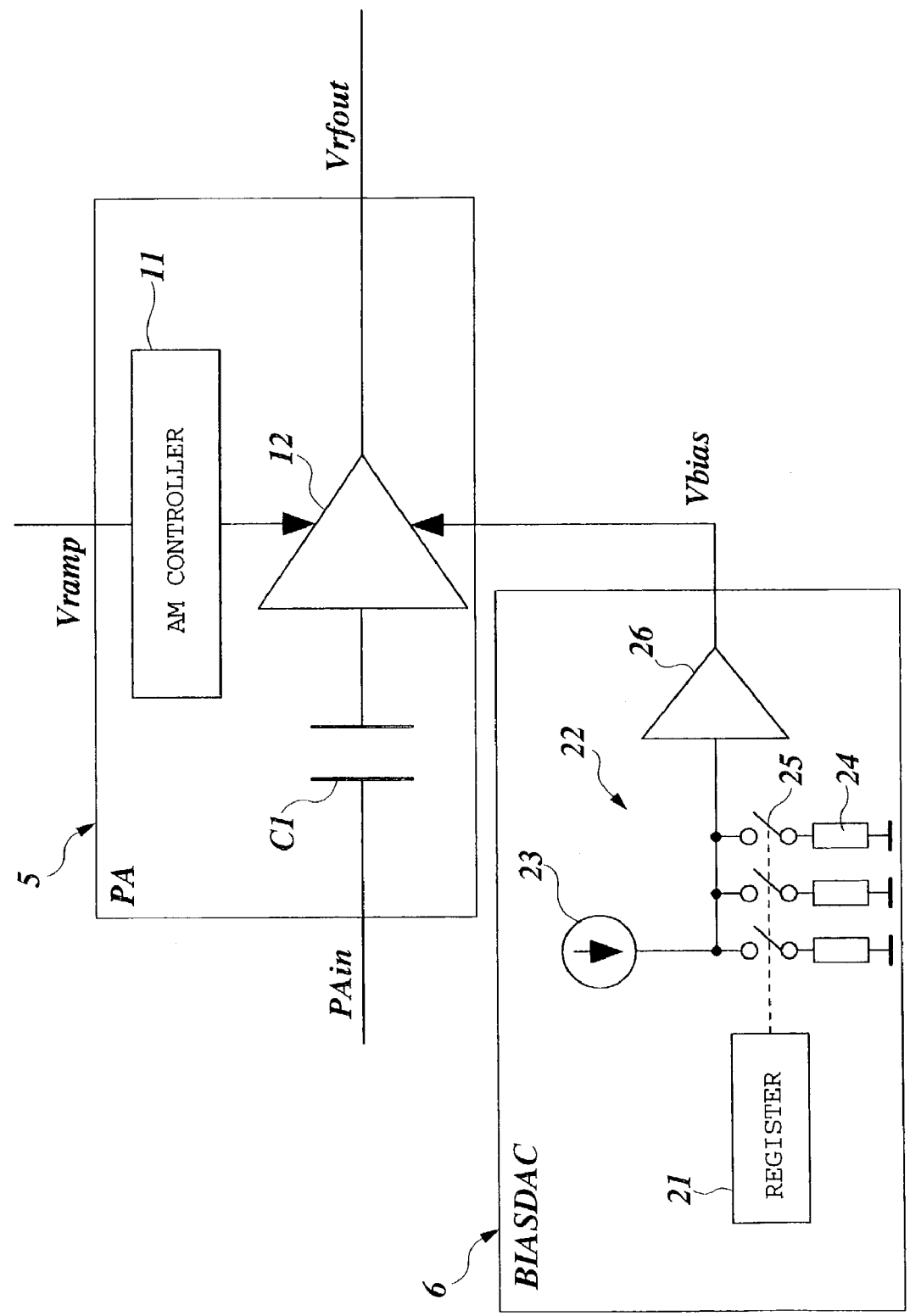
FIG. 2 is a schematic block diagram showing a PA and a BIASDAC in a mobile phone according to an embodiment of the present invention.

Descriptions will be made for an example of the connection between the PA and the BIASDAC and the configuration of the same referring to FIGS. 2 to 4. FIG. 2 schematically shows a configuration of the PA and the BIASDAC, FIG. 3 schematically shows a circuit of the PA, and FIG. 4 schematically shows a configuration of the BIASDAC, respectively.

As shown in FIG. 2, the PA 5 is constituted of an AM controller 11, an amplifier 12, a capacitor C1, and the like. Although not particularly limited, the PA 5 is constituted as a module in which the AM controller 11 and the amplifier 12 are formed on a semiconductor chip as an integrated circuit and the integrated circuit and the element such as the capacitor C1 are mounted on a common ceramic substrate. In this PA 5, a signal PAin of the phase modulation component is inputted, and a signal Vramp of the amplitude modulation component is inputted to the AM controller 11, these signals are amplified by the amplifier 12 in a state where a bias voltage Vbias is applied, and then outputted as a signal Vrfout obtained by adding the amplitude component to the phase component.

Figure 3:
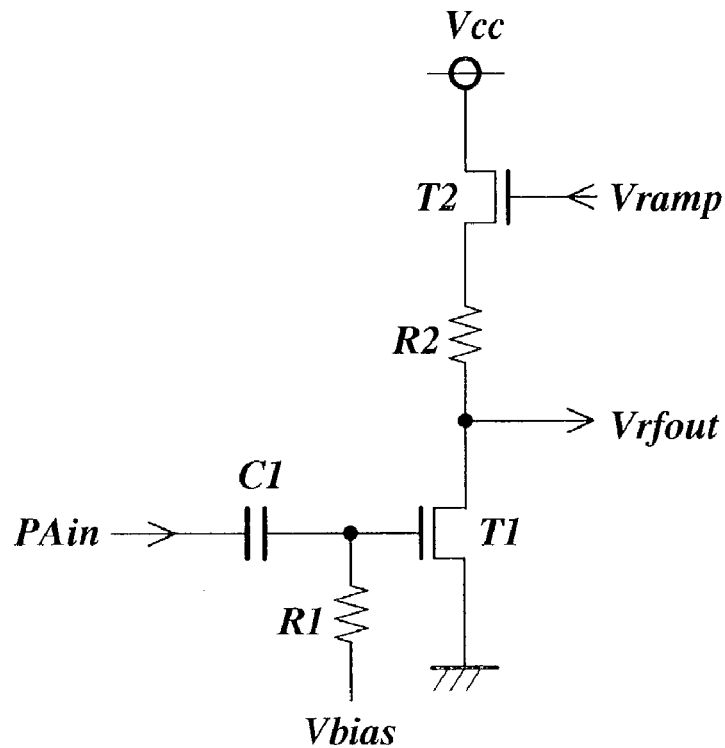
FIG. 3 is a schematic circuit diagram showing a PA in a mobile phone according to an embodiment of the present invention.
Figure 4:
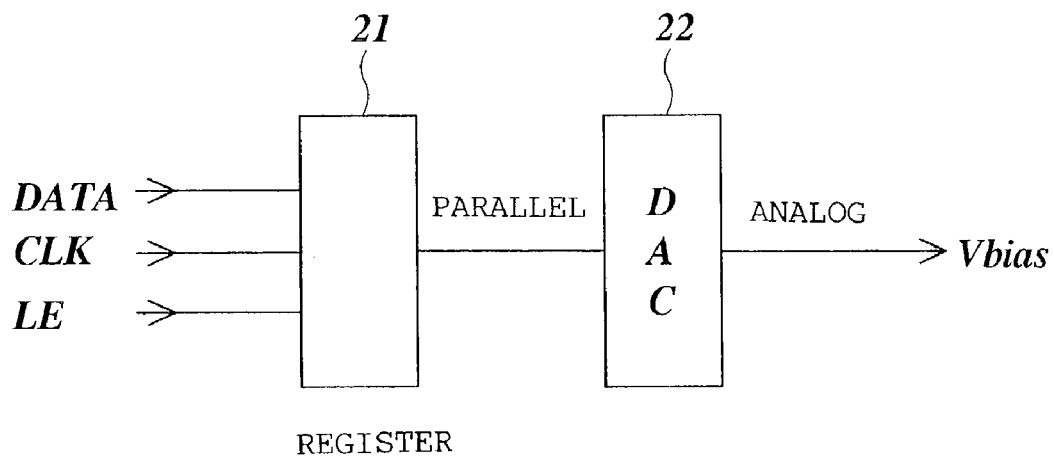
FIG. 4 is a schematic block diagram showing a BIASDAC in a mobile phone according to an embodiment of the present invention.

More specifically, the PA 5 is constituted of, for example, the capacitor C1, transistors T1 and T2, resistors R1 and R2, and the like as shown in an example in FIG. 3. The gate terminal, the drain terminal, and the source terminal of the transistor T1 are connected to the PAin terminal via the capacitor C1, the Vrfout terminal, and the ground potential, respectively. Further, the gate terminal of the transistor T1 is connected to the Vbias terminal via the resistor R1. The gate terminal, the drain terminal, and the source terminal of the transistor T2 are connected to the Vramp terminal, the Vcc potential, and the Vrfout terminal via the transistor R2, respectively.

The BIASDAC 6 is constituted of a register 21, DAC 22, and the like. The DAC 22 is provided with a current source 23, a parallel circuit of resistors 24 and switches 25, an amplifier 26, and the like. In the BIASDAC 6, data corresponding to a bias voltage Vbias that can be applied to the characteristic variation of the PA 5 is stored in the register 21 and the switches 25 are turned on and off based on the data in the register 21 so that resistance of the resistors 24 in the parallel circuit matches with the characteristic of the PA 5. Then, the bias voltage Vbias that matches with the characteristic of the PA 5 is outputted from the DAC 22 via the amplifier 26.

More specifically, in the BIASDAC 6 having a configuration including the register 21 and the DAC 22 as shown in an example in FIG. 4, data DATA from the outer BBLSI 3 is taken in the register 21 synchronously with a clock signal CLK by means of the activation (start) of a load enable signal LE, and then the data DATA is held therein. Thereafter, the data held in the register 21 is transmitted to the DAC 22 by the parallel transmission, and is converted in the DAC 22 from the digital signal into the analog signal, and then outputted as the bias voltage Vbias. The bias voltage Vbias is supplied from the BIASDAC 6 to the PA 5 by one pin terminal based on an analog system.

In the connection between the PA 5 and the BIASDAC 6 having the structure as described above, the signal PAin of the phase modulation component is inputted and the signal Vramp of the amplitude modulation component is also inputted to the PA 5. Then, the inputted signals are amplified by the amplifier 12 and the signal Vrfout obtained by adding the amplitude component to the amplified phase component is outputted from the PA 5.

At this time, in the BIASDAC 6, the switches 25 are turned on and off based on the data in the register 21 so that resistance of the resistors 24 in the parallel circuit matches with the characteristic of the PA 5, and the bias voltage Vbias that matches with the characteristic of the PA 5 is set. Then, the bias voltage Vbias that matches with the characteristic of the PA 5 is supplied from the BIASDAC 6, and whereby it becomes possible to maximize the performance of the PA 5.

Figure 5:
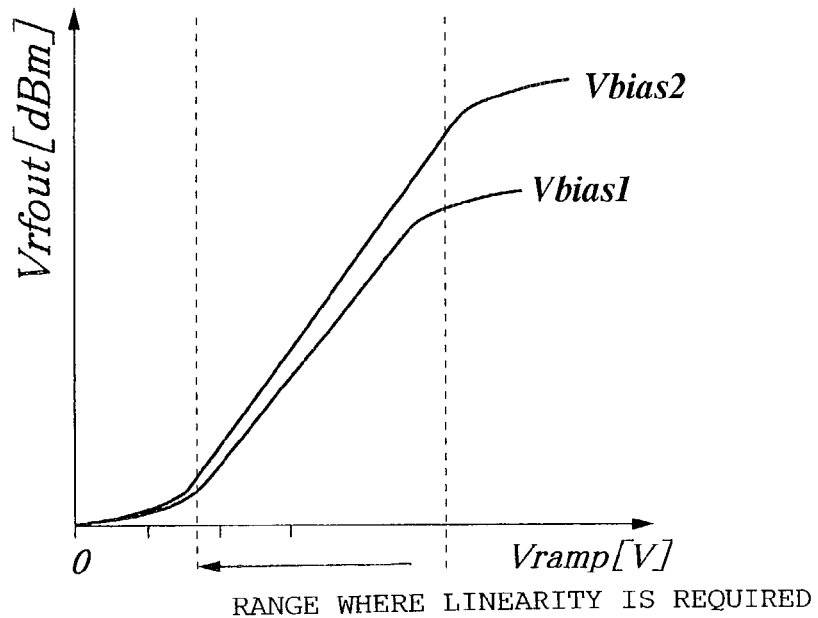
FIG. 5 is an explanatory diagram showing a characteristic of a PA in a case where linearity can not be obtained in a range where the linearity is required in a mobile phone according to an embodiment of the present invention.
Figure 6:
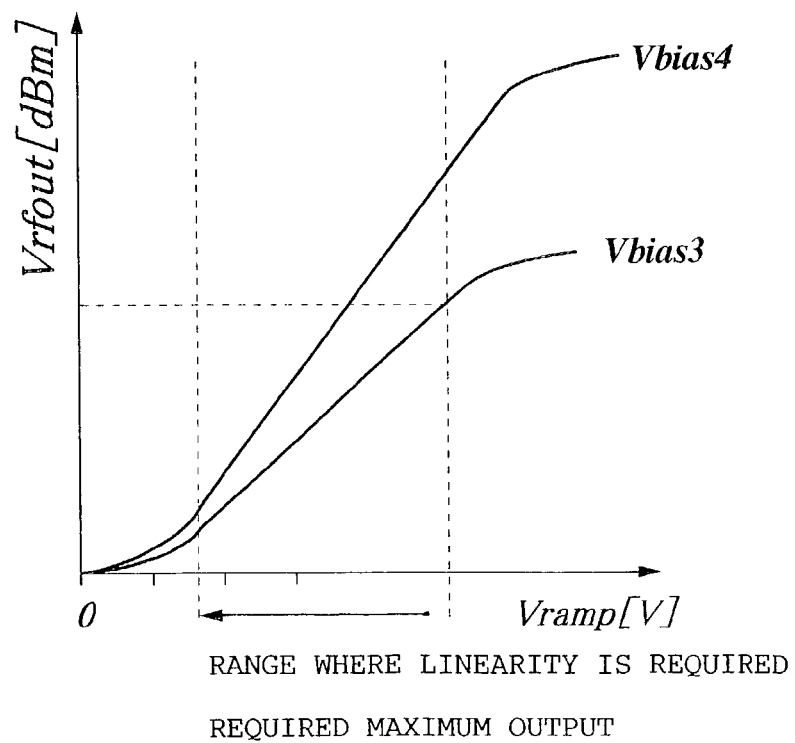
FIG. 6 is an explanatory diagram showing a characteristic of a PA in a case where accuracy can not be obtained in a range where the linearity is required in a mobile phone according to an embodiment of the present invention.

Descriptions will be made for an example of the characteristic of the PA referring to FIGS. 5 and 6. FIG. 5 shows a case where linearity can not be obtained in a range where linearity is required and FIG. 6 shows a case where accuracy can not be obtained in a range where linearity is required, respectively. Each of the horizontal axes represents the signal Vramp [V] of the amplitude modulation component and each of the vertical axes represents the signal Vrfout [dBm] obtained by adding the amplitude component to the amplified phase component.

On constituting the polar loop in the PA 5, it is desirable to have linearity and infinite bandwidth so as not to be distorted relative to the amplitude signals. In actual cases, however, a certain gain and linearity are shown at the time of high power level (Vramp=large) but the linearity can not be obtained and gain of the PA 5 is changed at the time of low power level (Vramp=small).

In an example of the characteristic shown in FIG. 5, the linear part of the PA 5 changes depending on the value of the bias voltage Vbias applied from the BIASDAC 6. When the bias voltage Vbias is set to Vbias 1, it is impossible to maintain the linearity in a range where the linearity is required. Therefore, the bias voltage Vbias is set to Vbias 2 in order to give the linearity in a range where the linearity is required.

In an example of the characteristic shown in FIG. 6, the linearity is maintained in both cases where the bias voltage Vbias is set to Vbias 3 and Vbias 4. However, when the bias voltage Vbias is set to the Vbias 4, the use range of the signal Vramp of the amplitude modulation component relative to the required maximum output becomes small. Therefore, it is impossible to perform the accurate control by the signal Vramp. Thus, the bias voltage Vbias is set to the Vbias 3 so that the variable range by the signal Vramp can be maximized in the range where the linearity is required.

As described above, the linearity is maintained in the range where the linearity is required and the bias voltage Vbias is set so that the variable range by the signal Vramp can be maximized in a range where the linearity is required. By so doing, it becomes possible to use the PA 5 efficiently. Note that, when the PA 5 is built in a mobile phone, the optimum value of the bias voltage Vbias corresponding to the respective characteristics is obtained and stored in the BBLSI 3. Then, the value of the bias voltage Vbias is written in the register 21 of the BIASDAC 6 in the RFIC 4 from the BBLSI 3 at the time of the switch-on of the mobile phone. Thus, the bias voltage corresponding to the PA 5 can be supplied.

Figure 7:
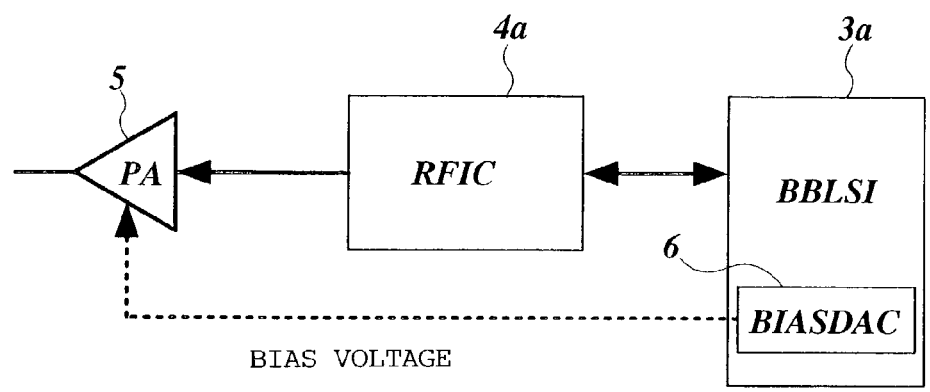
FIG. 7 is a schematic block diagram showing a mobile phone in a case where a BIASDAC is built in a BBLSI in a mobile phone according to an embodiment of the present invention.

Another configuration of a mobile phone will be described based on FIGS. 7 and 8. FIG. 7 shows a case where the BIASDAC is built in the BBLSI, and FIG. 8 shows a case where the BIASDAC is built in the PA, respectively, each of which has a system configuration in which the bias voltage can be set by the one pin.

In a configuration example of a mobile phone shown in FIG. 7, the BIASDAC 6 is built in a BBLSI 3*a* and the bias voltage is supplied to the PA 5 by the one analog pin. More specifically, the mobile phone is constituted of the BBLSI 3*a* having the BIASDAC 6 built therein, a RFIC 4*a*, the PA 5, and the like and the bias voltage can be supplied from the BIASDAC 6 built in the BBLSI 3*a* to the PA 5 by one pin based on an analog system.

Figure 8:
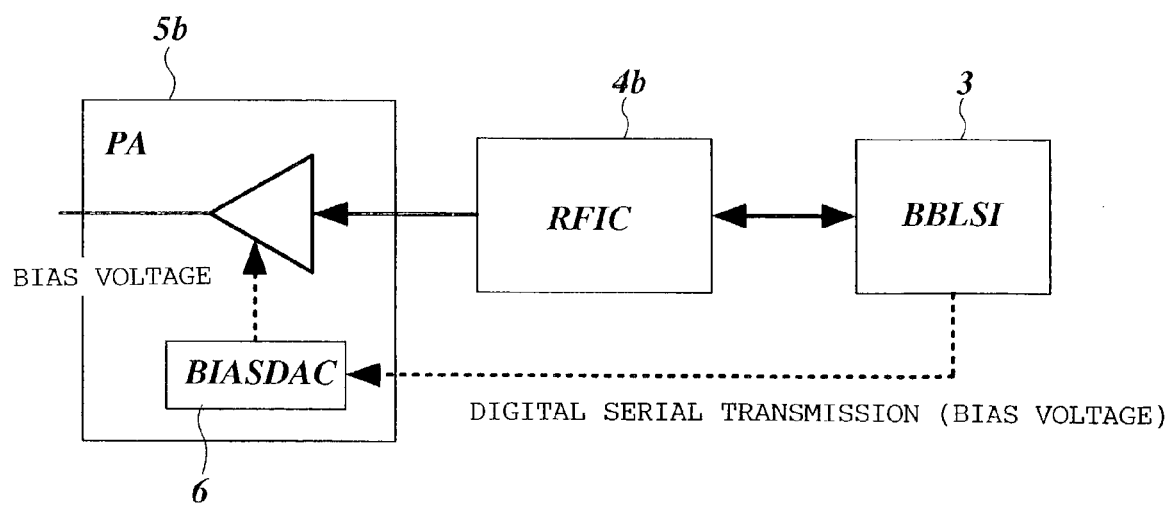
FIG. 8 is a schematic block diagram showing a mobile phone in a case where a BIASDAC is built in a PA in a mobile phone according to an embodiment of the present invention.

In a configuration example of a mobile phone shown in FIG. 8, the BIASDAC 6 is built in a PA 5*b* and the bias voltage is supplied to the PA 5*b* by the one pin for digital serial transmission. More specifically, the mobile phone is constituted of the BBLSI 3, an RFIC 4*b*, the PA 5*b* having the BIASDAC 6 built therein, and the like and the signal for setting the bias voltage can be supplied from the BBLSI 3 to the PA 5 by one pin by the digital serial transmission.

Therefore, according to the mobile phone in this embodiment, advantages as described below can be obtained.

(1) In a mobile phone performing the data transmission of EDGE system including the amplitude modulation, even when the PA 5 having characteristic variation is used, since the register 21 and the DAC 22 capable of optionally setting the bias voltage are used, it is possible to set the bias voltage so as to correspond to the characteristic variation of the PA 5 and to construct a system.

(2) Since the PA 5 and the BBLSI 3 or the RFIC 4 are connected to each other by using one pin, it is possible to supply the bias voltage to the PA 5 by using only one pin.

(3) In a system configuration in which the BIASDAC 6 is built in the PA 5 or the BBLSI 3, the BIASDAC 6 and the RFIC 4 or the BBLSI 3 are connected to each other by the use of one analog pin when the BIASDAC 6 is built in the RFIC 4 or in the BBLSI 3, or the BIASDAC 6 and the PA 5 are connected to each other by the use of one pin for digital serial transmission when the BIASDAC 6 is built in the Pa 5. Therefore, the connection therebetween can be made by the use of one pin terminal and one line to supply the bias voltage.

(4) Since even the PA 5 having the characteristic variation can be used to construct a system, it becomes possible to satisfy various specifications. As a result, mobile phones of various specifications can be constructed.

In the foregoing, the inventions made by the inventors thereof have been described in detail based on the embodiments. However, it goes without saying that the present is not limited to the embodiments and various modifications can be made therein without departing from the scope of the present invention.

For example, in the foregoing embodiments, the case where the bias voltage corresponding to the characteristic variation of the PA is set has been described. However, the present invention is not limited to this. More specifically, it is also possible to set a power supply voltage of the PA so as to correspond to the characteristic variation of the PA. Also in this case, similar to the case of the bias voltage, the configuration in which power supply voltage is set by the controllable voltage source composed of a register and the DAC can be employed.

Also, in the forgoing embodiments, descriptions have been made with using a mobile phone as an example. However, the present invention can also be effectively applied to, for example, an IC used for mobile phone compatible with the EDGE, and further applied to various types of apparatus for mobile communication systems.

The invention claimed is:

1. An apparatus for mobile communication system which performs signal transmission by amplitude modulation and phase modulation, comprising:

a power amplifier for amplifying a transmitting signal;

a control circuit for controlling transmitting and receiving of signals and capable of supplying a predetermined characteristic data for a bias voltage or a power source voltage of said power amplifier;

a radio frequency circuit for modulating the transmitting signal and demodulating a receiving signal; and a controllable voltage source which receives said predetermined characteristic data from said control circuit and provides said bias voltage or said power source voltage in accordance with said predetermined characteristic data, wherein said controllable voltage source includes a register for receiving and storing said predetermined characteristic data at a time of switching ON the apparatus and a digital to analog converter to output said bias voltage or said power source voltage based on said predetermined characteristic data stored in said register, and wherein said controllable voltage source is included in said radio frequency circuit, and a connection for setting said bias voltage or said power source voltage between said power amplifier and said radio frequency circuit or said control circuit is formed by an analog interface.

2. An apparatus for mobile communication system, which performs signal transmission by amplitude modulation and phase modulation, comprising:

a power amplifier for amplifying a transmitting signal;

a control circuit for controlling transmitting and receiving of signals and capable of supplying a predetermined characteristic data for a bias voltage or a power source voltage of said power amplifier;

a radio frequency circuit for modulating the transmitting signal and demodulating a receiving signal; and a controllable voltage source which receives said predetermined characteristic data from said control circuit and provides said bias voltage or said power source voltage in accordance with said predetermined characteristic data, wherein said controllable voltage source including a register for receiving and storing said predetermined characteristic data at a time of switching ON the apparatus and a digital to analog converter to output said bias voltage or said power source voltage based on said predetermined characteristic data stored in said register, and wherein said controllable voltage source is included in said control circuit, and a connection for setting said bias voltage or said power source voltage between said power amplifier and said control circuit is formed by a serial interface using digital signal.

* * * * *